US010403381B2

(12) United States Patent
Quinsat et al.

(10) Patent No.: US 10,403,381 B2
(45) Date of Patent: Sep. 3, 2019

(54) MAGNETIC MEMORY DEVICE

(71) Applicant: Toshiba Memory Corporation, Tokyo (JP)

(72) Inventors: Michael Arnaud Quinsat, Yokohama Kanagawa (JP); Takuya Shimada, Kawasaki Kanagawa (JP); Susumu Hashimoto, Nerima Tokyo (JP); Nobuyuki Umetsu, Kawasaki Kanagawa (JP); Yasuaki Ootera, Yokohama Kanagawa (JP); Masaki Kado, Kamakura Kanagawa (JP); Tsuyoshi Kondo, Kawasaki Kanagawa (JP); Shiho Nakamura, Fujisawa Kanagawa (JP); Tomoya Sanuki, Suzuka Mie (JP); Yoshihiro Ueda, Yokohama Kanagawa (JP); Yuichi Ito, Yokkaichi Mie (JP); Shinji Miyano, Yokohama Kanagawa (JP); Hideaki Aochi, Yokkaichi Mie (JP); Yasuhito Yoshimizu, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/918,344

(22) Filed: Mar. 12, 2018

(65) Prior Publication Data

US 2019/0088345 A1  Mar. 21, 2019

(30) Foreign Application Priority Data

Sep. 19, 2017 (JP) ................................. 2017-179563

(51) Int. Cl.
*G11C 19/08* (2006.01)
*H01L 43/08* (2006.01)
*H01L 43/10* (2006.01)

(52) U.S. Cl.
CPC .......... *G11C 19/0841* (2013.01); *H01L 43/08* (2013.01); *H01L 43/10* (2013.01)

(58) Field of Classification Search
CPC ...... G11C 19/0841; H01L 43/08; H01L 43/10
See application file for complete search history.

(56) References Cited

U.S. PATENT DOCUMENTS 6,898,132 B2 * 5/2005 Parkin .................... G11C 11/14
365/189.12
6,955,926 B2 * 10/2005 Chen ..................... G11C 19/02
438/128

(Continued)

FOREIGN PATENT DOCUMENTS

JP      2016-9806 A    1/2016
JP      6093146 B2     3/2017

OTHER PUBLICATIONS

Zhang, S. F. et al. Highly Efficient Domain Walls Injection in Perpendicular Magnetic Anisotropy Nanowire. Sci. Rep. 6, 24804; doi: 10.1038/srep24804 (2016).

(Continued)

*Primary Examiner* — Tri M Hoang
(74) *Attorney, Agent, or Firm* — Finnegan, Henderson, Farabow, Garrett & Dunner, L.L.P.

(57) ABSTRACT

According to one embodiment, a magnetic memory device includes a first magnetic member, a first electrode, a first magnetic layer, a first non-magnetic layer, a first conductive layer and a controller. The first magnetic member includes a first extending portion and a third magnetic portion. The first extending portion includes first and second magnetic portions. The third magnetic portion is connected with the second magnetic portion. The first electrode is electrically connected with the first magnetic portion. The first non-magnetic layer is provided between the first magnetic layer and at least a part of the third magnetic portion. The first (Continued)

conductive layer includes first and second conductive portions, and a third conductive portion being between the first conductive portion and the second conductive portion. The controller is electrically connected with the first electrode, the first magnetic layer, the first conductive portion and the second conductive portion.

20 Claims, 9 Drawing Sheets

(56) References Cited

U.S. PATENT DOCUMENTS

| | | | |
|---|---|---|---|
| 7,514,271 B2 | 4/2009 | Gaidis et al. | |
| 7,924,593 B2 | 4/2011 | Lee et al. | |
| 7,952,905 B2* | 5/2011 | Hwang | G11C 11/15 365/171 |
| 8,130,531 B2* | 3/2012 | Tsai | G11C 19/0841 365/80 |
| 8,233,305 B2* | 7/2012 | Lee | G11C 19/0808 365/171 |
| 9,165,675 B2 | 10/2015 | Annunziata | |
| 9,293,696 B2* | 3/2016 | Ootera | G11C 19/0841 |
| 9,515,123 B2* | 12/2016 | Nakamura | H01L 27/222 |
| 9,515,124 B2* | 12/2016 | Nakamura | H01L 27/228 |
| 2004/0252639 A1* | 12/2004 | Hunter | H04L 45/00 370/229 |
| 2010/0128510 A1* | 5/2010 | Cowburn | B82Y 10/00 365/80 |
| 2011/0156182 A1 | 6/2011 | Takeuchi et al. | |
| 2013/0235653 A1* | 9/2013 | Kondo | G11C 11/161 365/158 |
| 2014/0119111 A1 | 5/2014 | Nakamura et al. | |
| 2015/0380638 A1 | 12/2015 | Ootera et al. | |
| 2016/0056205 A1* | 2/2016 | Nakamura | H01L 27/228 257/252 |

OTHER PUBLICATIONS

T. Nogami et al., "Comparison of Key Fine-Line BEOL Metallization Schemes for Beyond 7 nm Node," 2017 Symposium on VLSI Technology Digest of Technical Papers (2017), 2 pages.

M. Durlam et al., "A Low Power 1Mbit MRAM based on 1T1MTJ Bit Cell Integrated with Copper Inerconnects," Motorola Semiconductor Products Sector and Motorola Labs, VLSI 2002 c12p4 (Jun. 12, 2002), 22 pages.

* cited by examiner

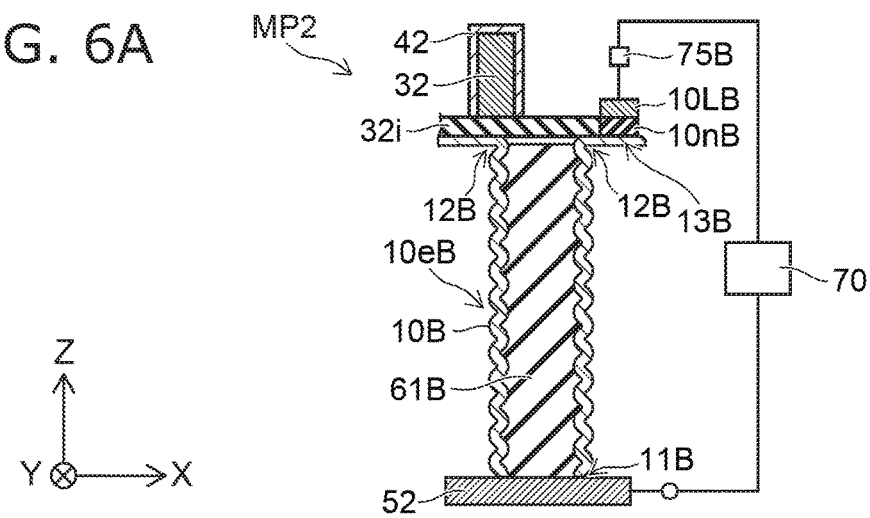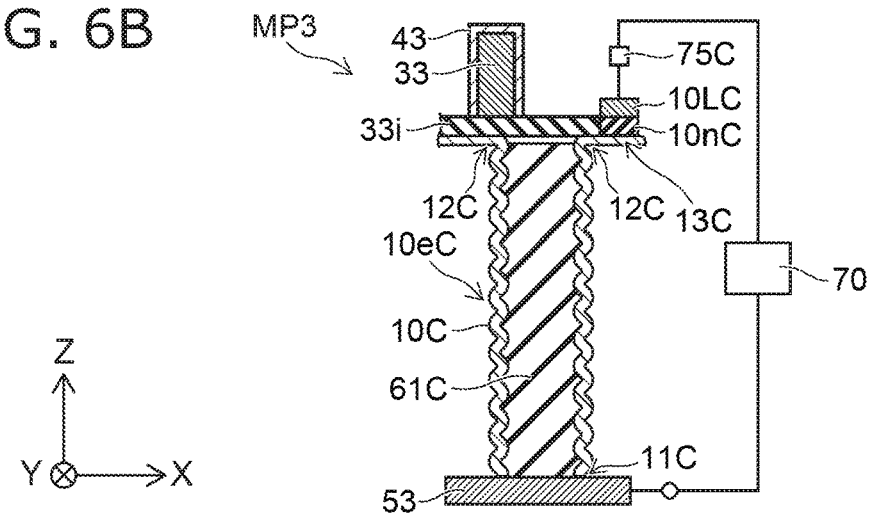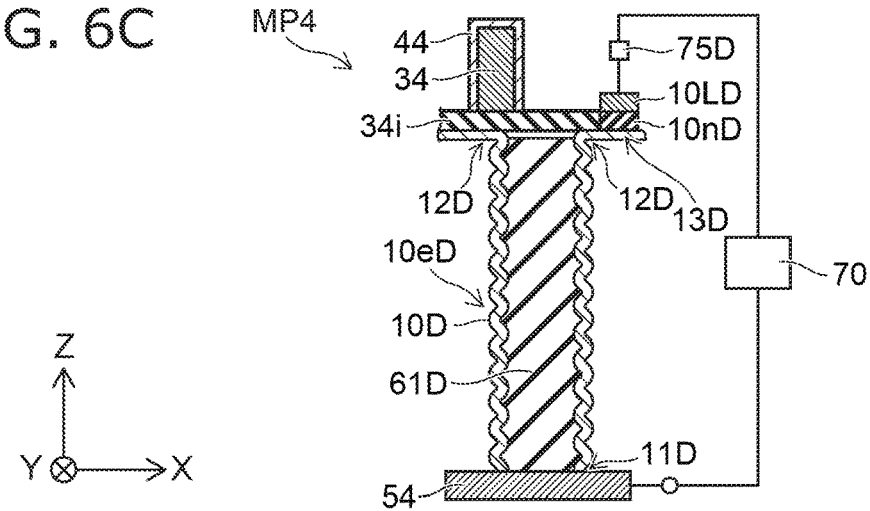

MAGNETIC MEMORY DEVICE

CROSS-REFERENCE TO RELATED APPLICATIONS

This application is based upon and claims the benefit of priority from Japanese Patent Application No. 2017-179563, filed on Sep. 19, 2017; the entire contents of which are incorporated herein by reference.

FIELD

Embodiments described herein relate generally to a magnetic memory device.

BACKGROUND

There exists a magnetic memory device including a magnetic shift register based on a magnetic material. A stable operation is required in the magnetic memory device.

BRIEF DESCRIPTION OF THE DRAWINGS

FIG. 6A to FIG. 6C are schematic views illustrating the magnetic memory device according to the first embodiment;

DETAILED DESCRIPTION

Figure 1A:
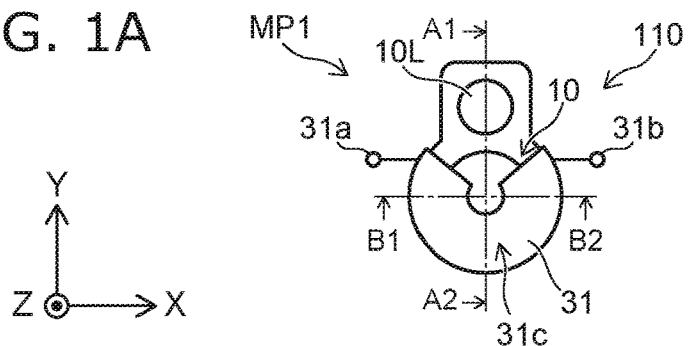
FIG. 1A to FIG. 1C are schematic views illustrating a magnetic memory device according to a first embodiment.

According to one embodiment, a magnetic memory device includes a first magnetic member, a first electrode, a first magnetic layer, a first non-magnetic layer, a first conductive layer and a controller. The first magnetic member includes a first extending portion being tubular and a third magnetic portion. The first extending portion includes a first magnetic portion and a second magnetic portion. The first extending portion extends along a first direction. The third magnetic portion is connected with the second magnetic portion. A direction from the first magnetic portion toward the second magnetic portion is along the first direction. The first electrode is electrically connected with the first magnetic portion. The first non-magnetic layer is provided between the first magnetic layer and at least a part of the third magnetic portion. The first conductive layer includes a first conductive portion, a second conductive portion, and a third conductive portion being between the first conductive portion and the second conductive portion. A direction from at least a part of the second magnetic portion toward at least a part of the third conductive portion is along the first direction. The controller is electrically connected with the first electrode, the first magnetic layer, the first conductive portion and the second conductive portion. The controller is configured to supply a first current to the first conductive layer in a first operation. The first current flows between the first conductive portion and the second conductive portion. The controller is configured to apply a voltage between the first electrode and the first magnetic layer in a second operation.

According to another embodiment, a magnetic memory device includes a first magnetic member, a first electrode, a first magnetic layer, a first non-magnetic layer, a first conductive layer, and a controller. The first magnetic member includes a first extending portion being tubular and a third magnetic portion. The first extending portion includes a first magnetic portion and a second magnetic portion. The first extending portion extends along a first direction. The third magnetic portion is connected with the second magnetic portion. A direction from the first magnetic portion toward the second magnetic portion is along the first direction. The first electrode is electrically connected with the first magnetic portion. The first non-magnetic layer is provided between the first magnetic layer and at least a part of the third magnetic portion. The first conductive layer includes a first conductive portion, a second conductive portion, and a third conductive portion being between the first conductive portion and the second conductive portion. At least a part of the third conductive portion curves along the first extending portion. The controller is electrically connected with the first electrode, the first magnetic layer, the first conductive portion and the second conductive portion. The controller is configured to supply a first current to the first conductive layer in a first operation, the first current flowing between the first conductive portion and the second conductive portion. The controller is configured to apply a voltage between the first electrode and the first magnetic layer in a second operation.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are

First Embodiment

Figure 1B:
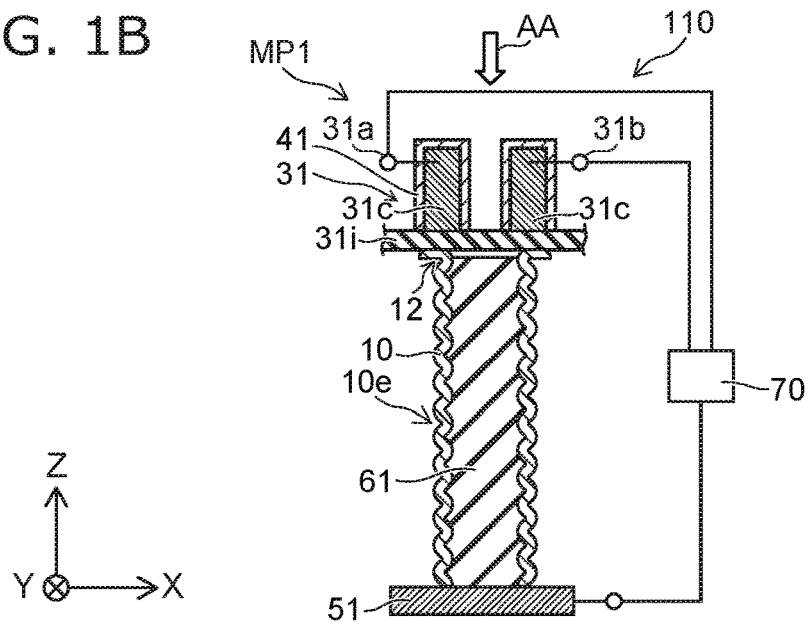
Figure 1C:
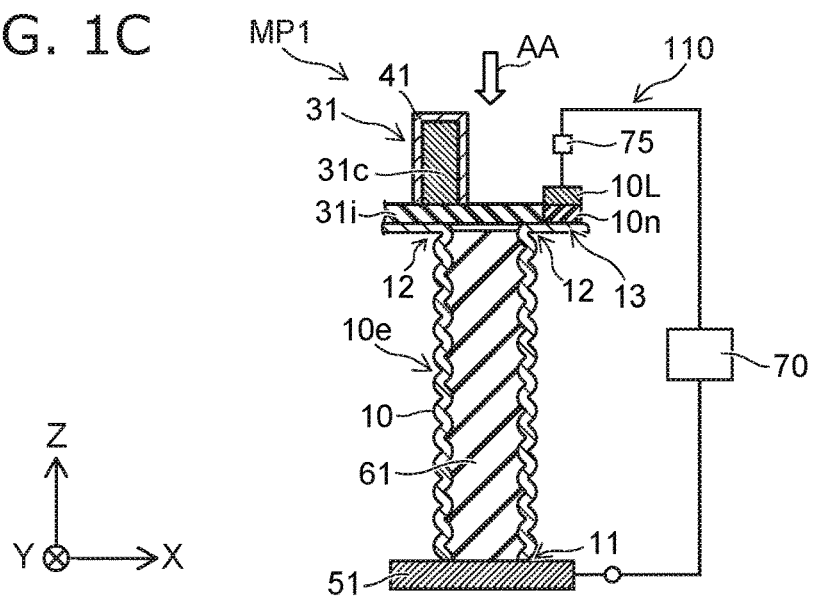

FIG. 1A to FIG. 1C are schematic views illustrating a magnetic memory device according to a first embodiment.

FIG. 1A is a plan view seen from the arrow AA of FIG. 1B and FIG. 1C. FIG. 1B is a B1-B2 line sectional view of FIG. 1A. FIG. 1C is an A1-A2 line sectional view of FIG. 1A.

As shown in FIG. 1A to FIG. 1C, a magnetic memory device 110 according to the embodiment includes a first magnetic member 10, a first electrode 51, a first magnetic layer 10L, a first non-magnetic layer 10n, a first conductive layer 31, and a controller 70.

The first magnetic member 10 includes a first extending portion 10e. The first extending portion 10e extends along a first direction. The first extending portion 10e is tubular extending along the first direction, for example.

The first direction is taken as a Z-axis direction. A direction perpendicular to the Z-axis direction is taken as an X-axis direction. A direction perpendicular to the Z-axis direction and the X-ax is taken as a Y-axis direction.

The first extending portion 10e includes a first magnetic portion 11 and a second magnetic portion 12. The direction from the first magnetic portion 11 toward the second magnetic portion 12 is along the first direction.

The first electrode 51 is electrically connected with the first magnetic portion 11.

In the specification, "the state of being electrically connected" includes a state where a plurality of conductors contact physically and current flows between the conductors. Further, "the state of being electrically connected" includes a state where another conductor is inserted between conductors and a current flows through these conductors. Furthermore, "the state of being electrically connected" includes a state in which an electric element is inserted between conductors and a state where a current flows through these conductors can be formed. The electric element includes an element etc. which have a nonlinear electrical property, for example.

The first non-magnetic layer 10n is provided between the at least parts of the first magnetic layer 10L and the third magnetic portion 13.

The first conductive layer 31 includes a first conductive portion 31a, a second conductive portion 31b, and a third conductive portion 31c. The third conductive portion 31c is located between the first conductive portion 31a and the second conductive portion 31b. A direction from at least a part of the second magnetic portion 12 toward at least a part of the third conductive portion 31c is along the first direction (Z-axis direction). For example, the third conductive portion 31c overlaps the at least the part of the second magnetic portion 12 in the Z-axis direction. For example, the third conductive portion 31c overlaps the at least the part of the first extending portion 10e in the Z-axis direction.

The controller 70 is electrically connected with the first electrode 51, the first magnetic layer 10L, the first conductive portion 31a, and the second conductive portion 31b. In this example, a first functional element 75 is provided on a current path between the first magnetic layer 10L and the controllers 70. The first functional element 75 is a transistor, for example. Alternatively, the first functional element 75 is a nonlinear element.

The first extending portion 10e of the first magnetic member 10 functions as a shift register which memorizes information, for example. The third magnetic portion 13 of the first magnetic member 10 functions as a reading portion of information. The first magnetic layer 10L, the first non-magnetic layer 10n, and the third magnetic portion 13 function as reading elements. The first magnetic layer 10L, the first non-magnetic layer 10n, and the third magnetic portion 13 serve as an MTJ element, for example.

The first magnetic member 10, the first magnetic layer 10L, and the first non-magnetic layer 10n become one memory portion (a first memory portion MP1).

In this example, a first insulating layer 31i is further provided. The first insulating layer 31i is provided between the at least the part of the second magnetic portion 12 and the at least the part of the third conductive portion 31c.

In this example, a first magnetic film 41 is further provided. The first conductive layer 31 (the third conductive portion 31c, in this example) is located between the first magnetic film 41 and the first insulating layer 31i in the Z-axis direction. The first conductive layer 31 (the third conductive portion 31c, in this example) is located between two parts of the first magnetic film 41 in the X-Y plane.

In this example, a first insulation part 61 is provided in the first extending portion 10e being tubular.

The first magnetic member 10 includes at least one selected from the group consisting of Fe, Co, and nickel, for example. Examples of the material of the first magnetic member 10 will be described later. The first magnetic layer 10L includes at least one selected from the group consisting of Fe, Co, and nickel, for example. Examples of the material of the first magnetic layer 10L will be described later. The first non-magnetic layer 10n includes MgO etc., for example. Examples of the material of the first non-magnetic layer 10n will be descried later. Cu etc. are used for the first electrode 51, for example. Examples of the material of the first electrode 51 will be described later. The first insulation part 61 includes at least one selected from the group consisting of silicon oxide, nitride silicon, silicon oxynitride, and an aluminum oxide, for example.

In the magnetic memory device 110, a magnetic field is generated by the current flowing in the first conductive layer 31. This magnetic field is applied to the first magnetic member 10. Thereby, magnetization of the first magnetic member 10 is controlled. For example, depending on the orientation of the current flowing in the first conductive layer 31, information held in first magnetic member 10 is changed. Such an operation is performed by the controller 70.

The controller 70 supplies a first current to the first conductive layer 31 in one operation (a first operation). The first current flows between the first conductive portion 31a and the second conductive portion 31b. Thereby, a writing operation is performed.

In another operation (a second operation), the controller 70 applies a voltage between the first electrode 51 and the first magnetic layer 10L. Thereby, a current (a second current) flows into the first extending portion 10e. By the second current, information (for example, magnetization information) which is held in the first extending portion 10e shifts in the first extending portion 10e. Thereby, a shift operation is performed.

In further another operation (a third operation), the controller 70 detects a value (at least one of resistance value, a voltage value, and a current value) corresponding to the electrical resistance between the first electrode 51 and the first magnetic layer 10L. Thereby, a reading operation is performed. For example, the electrical resistance between the third magnetic portion 13 and the first magnetic layer 10L changes depending on the state (information) of magnetization of the third magnetic portion 13. The change of this electrical resistance is based on a magneto-resistive effect, for example.

Figure 2:
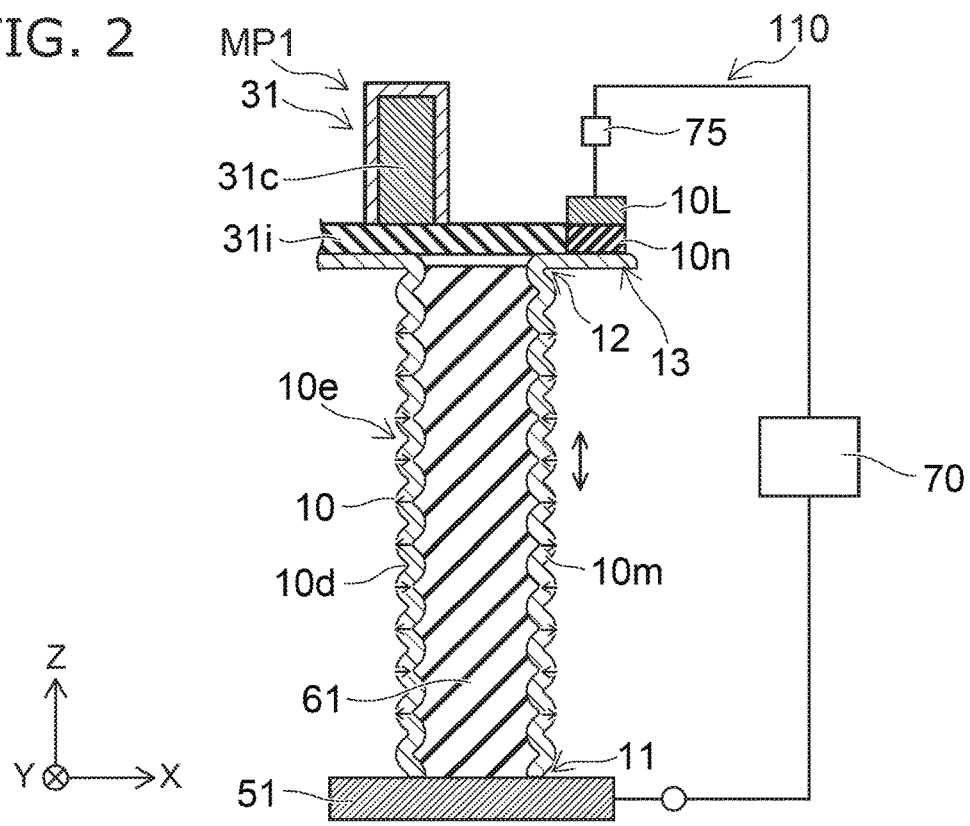
FIG. 2 is a schematic view illustrating the operation of the magnetic memory device according to the first embodiment.

FIG. 2 is a schematic view illustrating the operation of the magnetic memory device according to the first embodiment.

As shown in FIG. 2, a magnetization 10m of the first extending portion 10e of the first magnetic member 10 crosses the first direction (Z-axis direction), for example. The magnetization 10m is along a radial direction of the tubular first extending portion 10e. For example, the magnetization 10m orients from the inner side toward the outside. Alternatively, the magnetization 10m orients from the outside toward the inner side. The difference in the orientation of the magnetization 10m corresponds to the difference in information. In the first extending portion 10e, a plurality of magnetic domains 10d are provided. Information is held (memorized) in the plurality of magnetic domains 10d.

In this example, the width (a length of a direction crossing the Z-axis direction) of the first extending portion 10e repeatedly increases and decreases along the Z-axis direction. The width (for example, the radius) of the first extending portion 10e varies periodically. Thereby, the controllability of the magnetization 10m increases.

In the shift operation, the magnetization 10m (information) of the first magnetic member 10 is shifted along the first extending portion 10e.

Thus, the first operation includes the writing operation of the information on the first magnetic member 10. The second operation includes the shift operation in which the information written in the first magnetic member 10 is shifted.

In the writing operation, when the first current flowing in the first conductive layer 31 is in a first orientation, information of one of "0" and "1" is written, for example. When the first current is in a second orientation, information of the other one of "0" and "1" is written, for example. For example, information written when the first current flows in the orientation from the first conductive portion 31a to the second conductive portion 31b differs from information written when the first current flows in the orientation from the second conductive portion 31b to the first conductive portion 31a.

The magnetic field by the first current is applied to the second magnetic portion 12 of the first magnetic member 10, for example. The second magnetic portion 12 corresponds to a portion in which information is written.

As already described, in the embodiment, the direction from at least the part of the second magnetic portion 12 toward the at least the part of the third conductive portion 31c is along the first direction (Z-axis direction). For example, the third conductive portion 31c overlaps the at least the part of the second magnetic portion 12 in the Z-axis direction. Thereby, the magnetic field by the first current is effectively applied to the second magnetic portion 12. For example, the writing operation is performed stably. For example, the writing operation by a small writing current can be performed. According to the embodiment, a magnetic memory device in which the stable operation is possible can be provided.

As shown in FIG. 1A, in the magnetic memory device 110, the at least the part of the third conductive portion 31c is curved along the second magnetic portion 12. The curve is rounded, for example. Thereby, the magnetic field generated by the third conductive portion 31c is applied to the second magnetic portion 12 more effectively. The more stable operation is obtained.

In the magnetic memory device 110, the third conductive portion 31c is covered by the first magnetic film 41, for example. The first magnetic film 41 corresponds to a cladding layer. For example, the first magnetic film 41 covers the first conductive layer 31 except a portion where the insulating layer 31i is provided, for example. The first magnetic film 41 concentrates the magnetic flux toward the second magnetic portion 12. Thereby, the magnetic field generated by the third conductive portion 31c can be applied to the second magnetic portion 12 more effectively. The more stable operation is obtained.

Figure 3A:
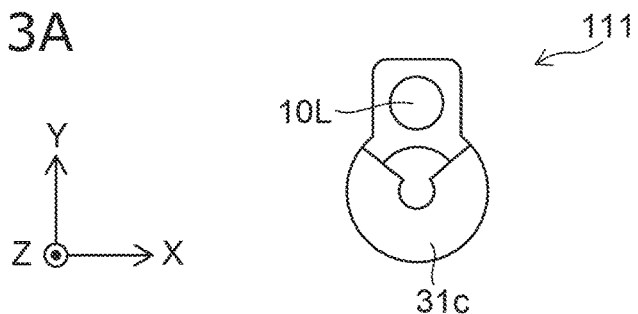
FIG. 3A and FIG. 3B are schematic views illustrating another magnetic memory device according to the first embodiment.
Figure 3B:
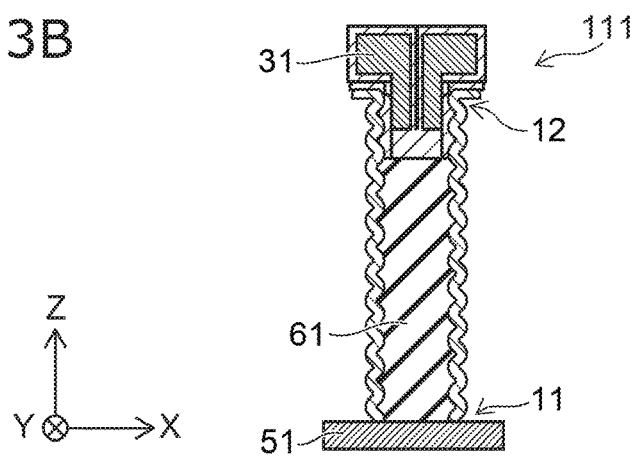

FIG. 3A and FIG. 3B are schematic views illustrating another magnetic memory device according to the first embodiment.

FIG. 3A is a plan view. FIG. 3B is a sectional view. Also in the magnetic memory device 111, the first magnetic member 10, the first electrode 51, the first magnetic layer 10L, the first non-magnetic layer 10n, the first conductive layer 31, and the controller 70 are provided. In these figures, the first non-magnetic layer 10n and the controller 70 are not shown.

Also in the magnetic memory device 111, the direction from the second magnetic portion 12 toward the part of the third conductive portion 31c is along the first direction (the Z-axis direction). The part of the third conductive portion 31c overlaps the second magnetic portion 12 in the Z-axis direction. Furthermore, the direction from another part of the third conductive portion 31c toward the second magnetic portion 12 crosses the first direction. For example, the other part of the third conductive portion 31c overlaps the second magnetic portion 12 in the X-Y plane.

The second magnetic portion 12 is located around the other part of the third conductive portion 31c in the magnetic memory device 111. In the second magnetic portion 12 being tubular (annular), the other part of the third conductive portion 31c is provided. The stable operation can be performed also in the magnetic memory device 111.

In the magnetic memory device 111, the size of the memory portion can be reduced. A high-density memory is obtained. The memory portion can be formed with a manufacturing method of a self alignment. The magnetic field by the first current can be effectively applied to the magnetic member.

Figure 4A:
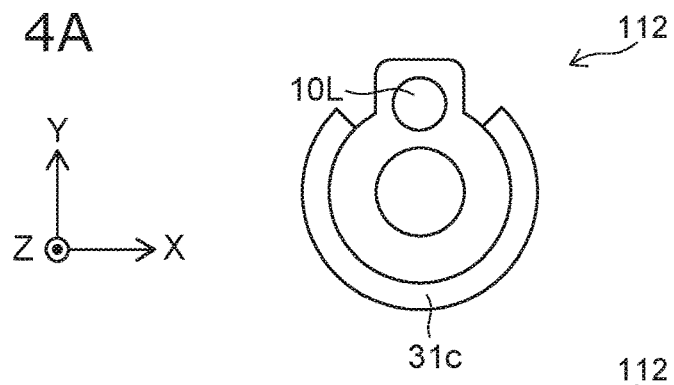
FIG. 4A and FIG. 4B are schematic views illustrating another magnetic memory device according to the first embodiment.
Figure 4B:
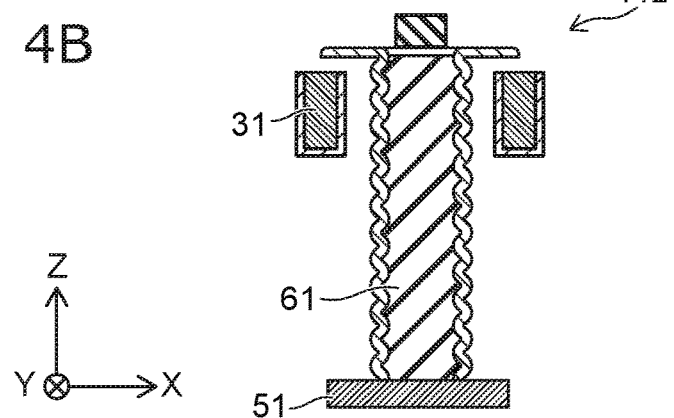

FIG. 4A and FIG. 4B are schematic views illustrating another magnetic memory device according to the first embodiment.

FIG. 4A is a plan view. FIG. 4B is a sectional view. Also in a magnetic memory device 112, the first magnetic member 10, the first electrode 51, the first magnetic layer 10L, the first non-magnetic layer 10n, the first conductive layer 31, and the controller 70 are provided. In these figures, the first non-magnetic layer 10n and the controller 70 are not shown.

Also in the magnetic memory device 112, the direction from the second magnetic portion 12 to the part of the third conductive portion 31c is along the first direction (the Z-axis direction). The direction from the other part of the third conductive portion 31c toward the second magnetic portion 12 crosses the first direction.

In the magnetic memory device 112, the other part of the third conductive portion 31c is located around the first extending portion 10e. The stable operation can be performed also in the magnetic memory device 112.

Also in the magnetic memory devices 111 and 112, at least the part of the third conductive portion 31c is curved along the second magnetic portion 12. The curve is rounded.

In the magnetic memory devices 110-112, the part of the third conductive portion 31c overlaps the second magnetic portion 12 in the Z-axis direction. In addition, the first insulating layer 31i is provided between the part of the third conductive portion 31c and the second magnetic portion 12. The thickness of the first insulating layer 31i along the first direction (along the Z-axis direction) is preferable to be not less than 2.5 nm and not more than 20 nm, for example. With such thickness, sufficient insulation is obtained. With such thickness, the magnetic field with a high intensity can be effectively applied to the second magnetic portion 12.

Figure 5A:
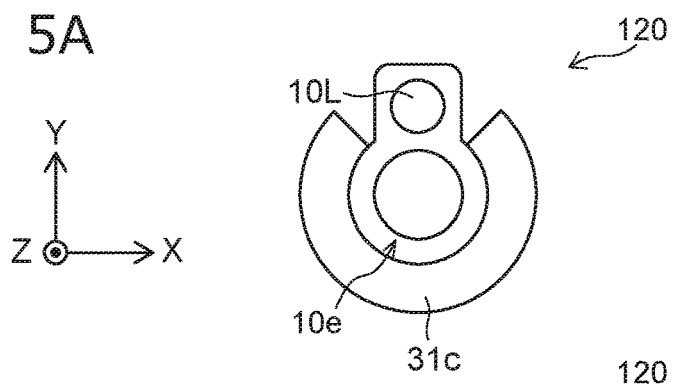
FIG. 5A and FIG. 5B are schematic views illustrating another magnetic memory device according to the first embodiment.
Figure 5B:
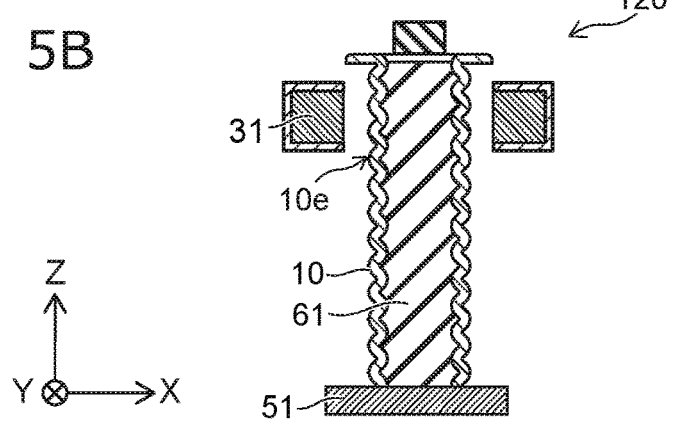

FIG. 5A and FIG. 5B are schematic views illustrating another magnetic memory device according to first embodiment.

FIG. 5A is a plan view. FIG. 5B is a sectional view. Also in a magnetic memory device 120, the first magnetic member 10, the first electrode 51, the first magnetic layer 10L, the first non-magnetic layer 10n, the first conductive layer 31, and the controller 70 are provided. In these figures, the first non-magnetic layer 10n and the controller 70 are not shown.

Also in the magnetic memory device 120, the third conductive portion 31c does not overlap the second magnetic portion 12 in the Z-axis direction. The third conductive portion 31c overlaps the second magnetic portion 12 in the X-Y plane. The configuration in the magnetic memory device 120 other than the third conduction portion 31c (first conductive layer 31) is the same as that of the magnetic memory device 110, for example.

As shown in FIG. 5A, the at least the part of the third conductive portion 31c is curved along the first extending portion 10e. The curve is rounded. Thereby, the magnetic field by the first current flowing in the third conductive portion 31c is effectively applied to the second magnetic portion 12. Thereby, the stable writing operation is obtained.

In the magnetic memory device 120, the distance between the first extending portion 10e and the third conductive portion 31c is preferable to be not less than 2.5 nm and not more than 10 nm. The distance is a distance along the X-Y plane. Sufficient insulation can be obtained by such the distance. According to such the distance, the magnetic field of a high intensity can be effectively applied to the first extending portion 10e (for example, second magnetic portion 12).

A plurality of memory portions may be provided in the embodiment. The example of the plurality of memory portions will be described bellow.

FIG. 6A-FIG. 6C are schematic views illustrating the magnetic memory device according to the first embodiment.

FIG. 6A-FIG. 6C illustrate second to fourth memory portions MP2-MP4.

As shown in FIG. 6A, in the second memory portion MP2, a second magnetic member 10B, a second electrode 52 and a second magnetic layer 10LB, and a second non-magnetic layer 10nB are provided.

The second magnetic member 10B includes a second extending portion 10eB being tubular. The second extending portion 10eB extends along the first direction (Z-axis direction). The second extending portion 10eB includes a fourth magnetic portion 11B and a fifth magnetic portion 12B. The direction from the fourth magnetic portion 11B toward the fifth magnetic portion 12B is along in the first direction. The second magnetic member 10B further includes a sixth magnetic portion 13B. The sixth magnetic portion 13B is connected with the fifth magnetic portion 12B.

The second electrode 52 is electrically connected with the fourth magnetic portion 11B. The second non-magnetic layer 10nB is provided between second magnetic layer 10LB and at least a part of the sixth magnetic portion 13B. A second insulation part 61B is provided in the second extending portion 10eB.

The controller 70 is further electrically connected with the second electrode 52 and second magnetic layer 10LB. In this example, a second functional element 75B is provided on a current path between the second magnetic layer 10LB and the controller 70. A second conductive layer 32 is provided in this example. The direction from at least a part of the fifth magnetic portion 12B toward the second conductive layer 32 is along the first direction. In the embodiment, the second conductive layer 32 may be continuous with the first conductive layer 31. The second electrode 52 may be continuous with the first electrode 51. A second insulating layer 32i is provided in this example. The second insulating layer 32i is provided between the at least the part of the fifth magnetic portion 12B and at least a part of the second conductive layer 32.

In this example, a second magnetic film 42 is further provided. For example, the second conductive layer 32 is located between the second magnetic film 42 and the second insulating layer 32i in the Z-axis direction. For example, the second conductive layer 32 is located between two parts of the second magnetic film 42 in the X-Y plane.

As shown in FIG. 6B, in the third memory portion MP3, a third magnetic member 10C, a third electrode 53 and a third magnetic layer 10LC, and a third non-magnetic layer 10nC are provided.

The third magnetic member 10C includes an extending portion 10eC being tubular. The extending portion 10eC extends along the first direction (the Z-axis direction). The extending portion 10eC includes a magnetic portion 11C and a magnetic portion 12C. The direction from the magnetic portion 11C toward the magnetic portion 12C is along the first direction. The third magnetic member 10C further includes a magnetic portion 13C. The magnetic portion 13C is connected with the magnetic portion 12C.

The third electrode 53 is electrically connected with the magnetic portion 11C. The third non-magnetic layer 10nC is provided between the third magnetic layer 10LC and at least a part of the magnetic portion 13C. A third insulation part 61C is provided in the extending portion 10eC.

The controller 70 is further electrically connected with the third electrode 53 and the third magnetic layer 10LC. In this example, a third functional element 75C is provided on a current path between the third magnetic layer 10LC and the controllers 70. A third conductive layer 33 is provided in this example. The direction from at least a part of the magnetic portion 12C toward the third conductive layer 33 is along the first direction. In the embodiment, the third conductive layer 33 may be continuous with the first conductive layer 31 or the second conductive layer 32. The third electrode 53 may be continuous with the first electrode 51 or the second electrode 52. A third insulating layer 33i is provided in this example. The third insulating layer 33i is provided between the at least the part of the magnetic portion 12C and at least a part of the third conductive layer 33.

In this example, a third magnetic film 43 is further provided. For example, the third conductive layer 33 is located between the third magnetic film 44 and the third insulating layer 33i in the Z-axis direction. For example, the third conductive layer 33 is located between two parts of the third magnetic film 42 in the X-Y plane.

As shown in FIG. 6C, in the fourth memory portion MP4, a fourth magnetic member 10D, a fourth electrode 54 and a fourth magnetic layer 10LD, and a fourth non-magnetic layer 10nD are provided.

The fourth magnetic member 10D includes an extending portion 10eD being tubular. The extending portion 10eD extends along the first direction (the Z-axis direction). The extending portion 10eD includes a magnetic portion 11D and a magnetic portion 12D. The direction from the magnetic portion 11D toward the magnetic portion 12D is along the first direction. The fourth magnetic member 10D further includes a magnetic portion 13D. The magnetic portion 13D is connected with the magnetic portion 12D.

The fourth electrode 54 is electrically connected with the magnetic portion 11D. The fourth non-magnetic layer 10nD is provided between the fourth magnetic layer 10LD and at least a part of the magnetic portion 13D. A fourth insulation part 61D is provided in the extending portion 10eD.

The controller 70 is further electrically connected with the fourth electrode 54 and the fourth magnetic layer 10LD. In this example, a fourth functional element 75D is provided on a current path between the fourth magnetic layer 10LD and the controllers 70. A fourth conductive layer 34 is provided in this example. The direction from at least a part of the magnetic portion 12D toward the fourth conductive layer 34 is along the first direction. In the embodiment, the fourth conductive layer 34 may be continuous with the first conductive layer 31, the second conductive layer 32, or the third conductive layer 33. The fourth electrode 54 may be continuous with the first electrode 51, the second electrode 52, or the third electrode 53. A fourth insulating layer 34i is provided in this example. The fourth insulating layer 34i is provided between the at least the part of the magnetic portion 12D, and the at least a part of the fourth conductive layer 34.

In this example, a fourth magnetic film 44 is further provided. For example, the fourth conductive layer 34 is located between the fourth magnetic film 44 and the fourth insulating layer 34i in the Z-axis direction. For example, the fourth conductive layer 34 is located between two parts of the fourth magnetic film 44 in the X-Y plane.

The same configuration as the first magnetic member 10 is applicable to the second magnetic member 10B, the third magnetic member 10C, and the fourth magnetic member 10D. The same configuration as the first electrode 51 is applicable to the second electrode 52, the third electrode 53, and the fourth electrode 54. The same configuration as the first magnetic layer 10L is applicable to the second magnetic layer 10LB, the third magnetic layer 10LC, and the fourth magnetic layer 10LD. The same configuration as the first non-magnetic layer 10n is applicable to the second non-magnetic layer 10nB, the third non-magnetic layer 10nC, and the fourth non-magnetic layer 10nD.

Figure 7:
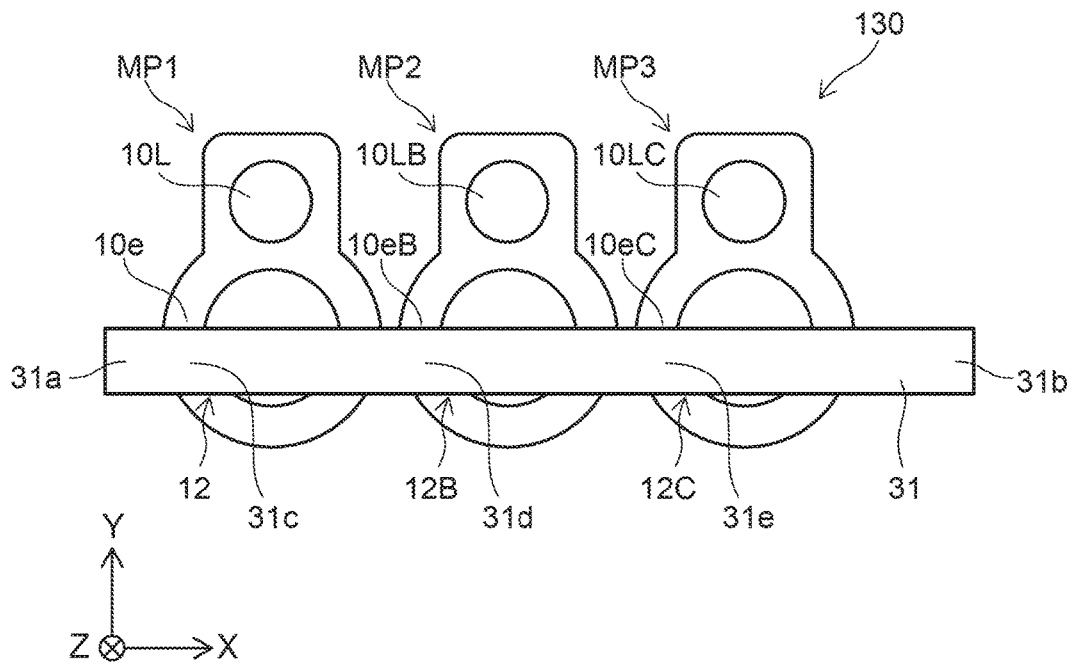
FIG. 7 is a schematic plan view illustrating another magnetic memory device according to the first embodiment.

FIG. 7 is a schematic plan view illustrating another magnetic memory device according to the first embodiment.

As shown in FIG. 7, a plurality of memory portions are provided in a magnetic memory device 130. In this example, the first memory portion MP1, the second memory portion MP2, and the third memory portion MP3 are shown. One conductive layer (the first conductive layer 31) is provided with respect to the plurality of memory portions.

For example, the first conductive layer 31 includes a fourth conductive portion 31d in addition to the first to third conductive portions 31a-31c. In this example, the first conductive layer 31 further includes a fifth conductive portion 31e. The fourth conductive portion 31d is located between the third conductive portion 31c and the second conductive portion 31b. The fifth conductive portion 31e is located between the fourth conductive portion 31d and the second conductive portion 31b.

In the second memory portion MP2, a direction from at least a part of the fifth magnetic portion 12B toward the fourth conductive portion 31d is along the first direction (Z-axis direction). At least a part of the fourth conductive portion 31d overlaps the fifth magnetic portion 12B in the Z-axis direction.

In the third memory portion MP3, a direction from the at least the part of the magnetic portion 12C toward the fifth conductive portion 31e is along the first direction (the Z-axis direction). At least a part of the fifth conductive portion 31e overlap the magnetic portion 12C in the Z-axis direction.

Also in such the magnetic memory device 130, a magnetic field by the first current flowing in the first conductive layer 31 is applied effectively to each of the memory portions. The stable operation can be obtained.

In this example, a direction from the first extending portion 10e toward the second extending portion 10eB is along a second direction. The second direction crosses the first direction (the Z-axis direction). In this example, the second direction is the X-axis direction. A direction from the first magnetic layer 10L toward the second magnetic layer 10LB is along the second direction (the X-axis direction). In this example, the first conductive layer 31 linearly extends along the X-axis direction.

Figure 8:
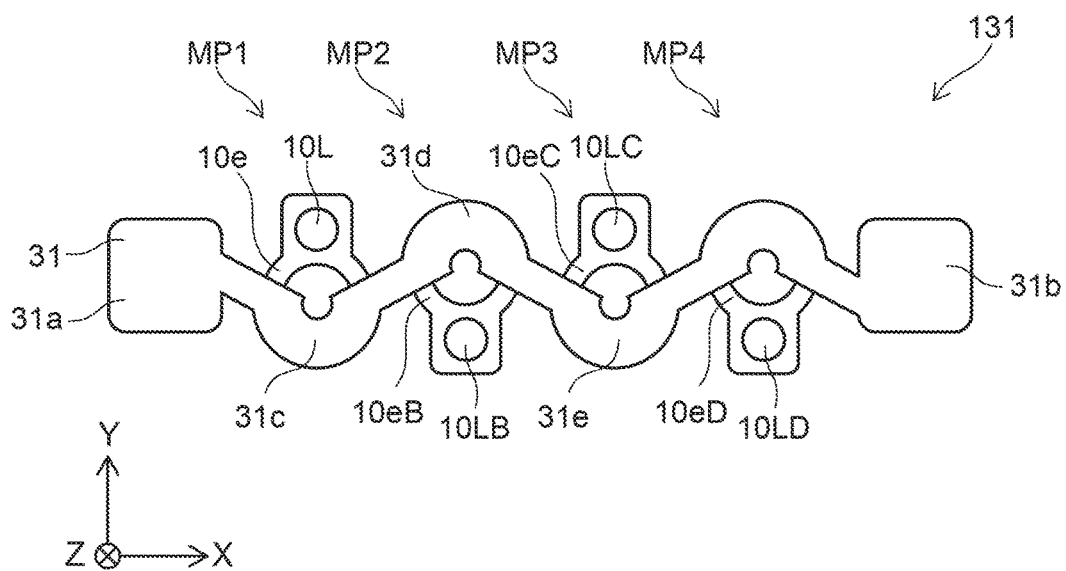
FIG. 8 is a schematic plan view illustrating another magnetic memory device according to the first embodiment.
Figure 9:
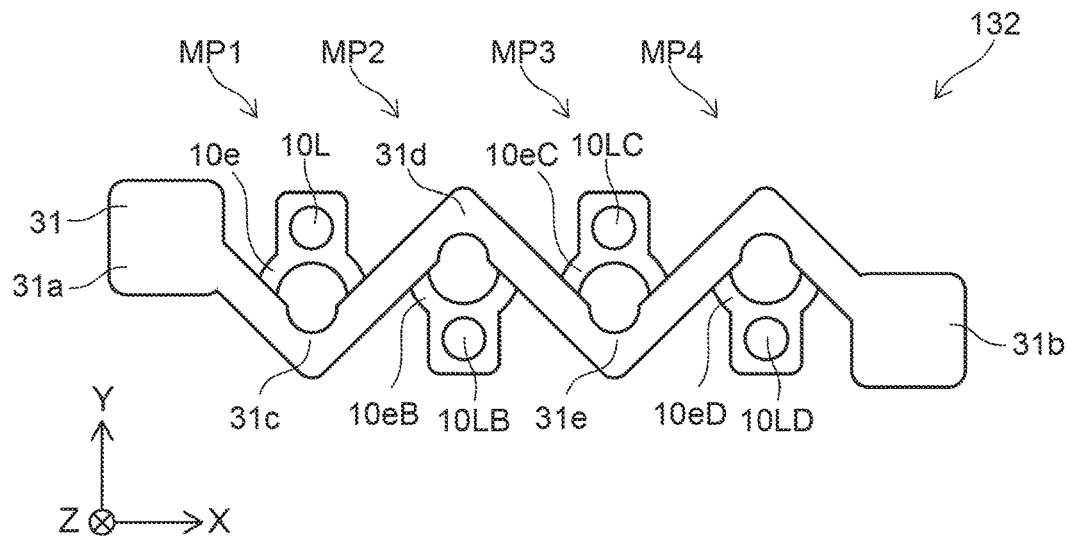
FIG. 9 is a schematic plan view illustrating another magnetic memory device according to the first embodiment.

FIG. 8 and FIG. 9 are schematic plan views illustrating another magnetic memory device according to the first embodiment.

As shown in FIG. 8 and FIG. 9, in magnetic memory devices 131 and 132, a plurality of memory portions (the first memory portion MP1, the second memory portion MP2, the third memory portion MP3, and the fourth memory portion MP4) are provided. A conductive layer (the first conductive layer 31) is provided with respect to the plurality of memory portions.

In the magnetic memory devices 131 and 132, a direction from the first extending portion 10e toward the second extending portion 10eB crosses a direction from the first magnetic layer 10L toward the second magnetic layer 10LB.

For example, a second direction from the second magnetic portion 12 toward the third magnetic portion 13 crosses the first direction (the Z-axis direction). The second direction in this case is the Y-axis direction. A direction from the at least the part of the third conductive portion 31c toward the at least the part of the fourth conductive portion 31d crosses the second direction (the Y-axis direction). The direction from the at least the part of the third conductive portion 31c toward the at least the part of the fourth conductive portion 31d is inclined with respect to the second direction (the Y-axis direction).

In the magnetic memory devices 131 and 132, a direction from the first extending portion 10e toward the third extending portion 10eC is along the X-axis direction. A direction from the second extending portion 10eB toward the fourth extending portion 10eD is along the X-axis direction. A direction from the first magnetic layer 10L toward the third magnetic layer 10LC is along the X-axis direction. A direction from the second magnetic layer 10LB toward the third magnetic layer 10LD is along the X-axis direction.

High density is obtained in the plurality of memory portions by the above-mentioned arrangement.

In the magnetic memory device 131, a direction from the first conductive portion 31a toward the second conductive portion 31b is along the X-axis direction. In the magnetic memory device 132, a direction from the first conductive portion 31a toward the second conductive portion 31b is inclined with respect to the X-axis direction.

In the magnetic memory device 131, the third conductive portion 31c is curved rounded. In the magnetic memory device 132, the direction of the third conductive portion 31c changes right-angled substantially.

Figure 10:
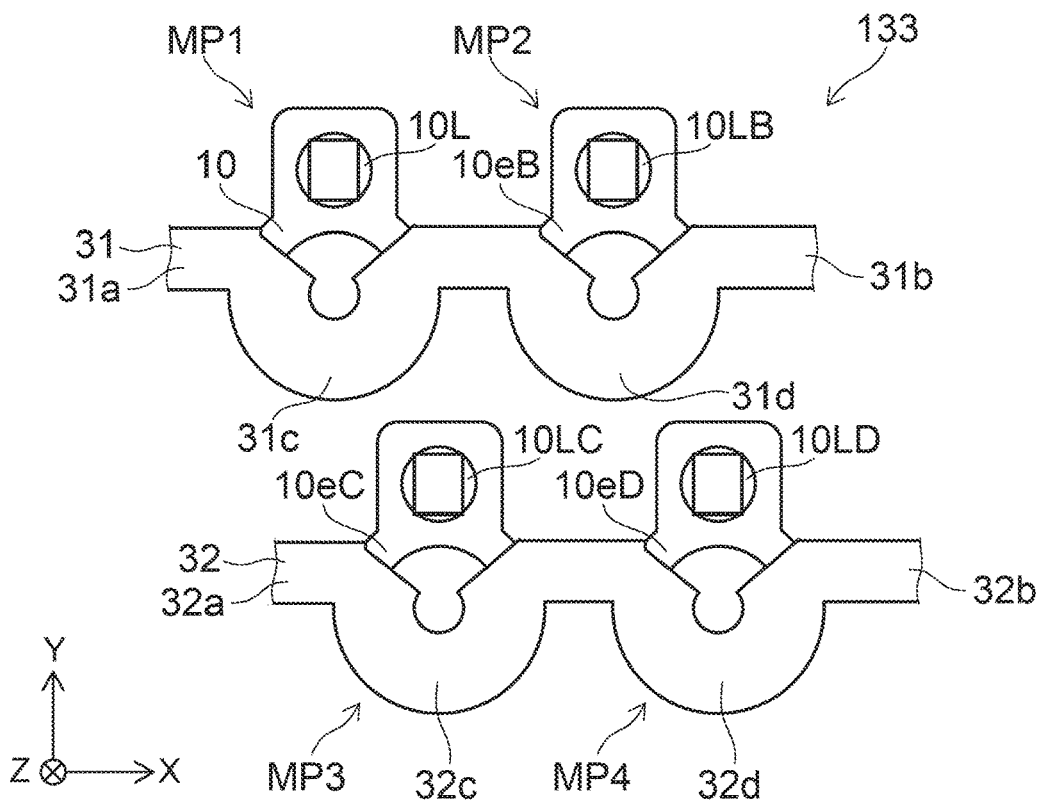
FIG. 10 is a schematic plan view illustrating another magnetic memory device according to the first embodiment.

FIG. 10 is a schematic plan view illustrating another magnetic memory device according to the first embodiment.

As shown in FIG. 10, in a magnetic memory device 133, a plurality of memory portions (first memory portion MP1, second memory portion MP2, third memory portion MP3, and fourth memory portion MP4) are provided. The first conductive layer 31 is provided for the first memory portion MP1 and the second memory portion MP2. The second conductive layer 32 is provided for the third memory portion MP3 and the fourth memory portion MP4.

A direction from the first extending portion 10e toward the second extending portion 10eB is along the X-axis direction. A direction from third extending portion 10eC toward the fourth extending portion 10eD is along the X-axis direction. A direction from the first magnetic layer 10L toward the second magnetic layer 10LB is along the X-axis direction. A direction from third magnetic layer 10LC toward the fourth magnetic layer 10LD is along the X-axis direction.

A position of the third extending portion 10eC in the X-axis direction is between a position of the first extending portion 10e in the X-axis direction and a position of the second extending portion 10eB in the X-axis direction. A position of the third magnetic layer 10LC in the X-axis direction is between a position of the first magnetic layer 10L in the X-axis direction and a position of the second magnetic layer 10LB in the X-axis direction.

The position of the third magnetic layer 10LC in the Y-axis direction is between a position of the first magnetic layer 10L in the Y-axis direction and a position of the second conductive layer 32 in the Y-axis direction. High memory density is obtained in the magnetic memory device 133.

Figure 11:
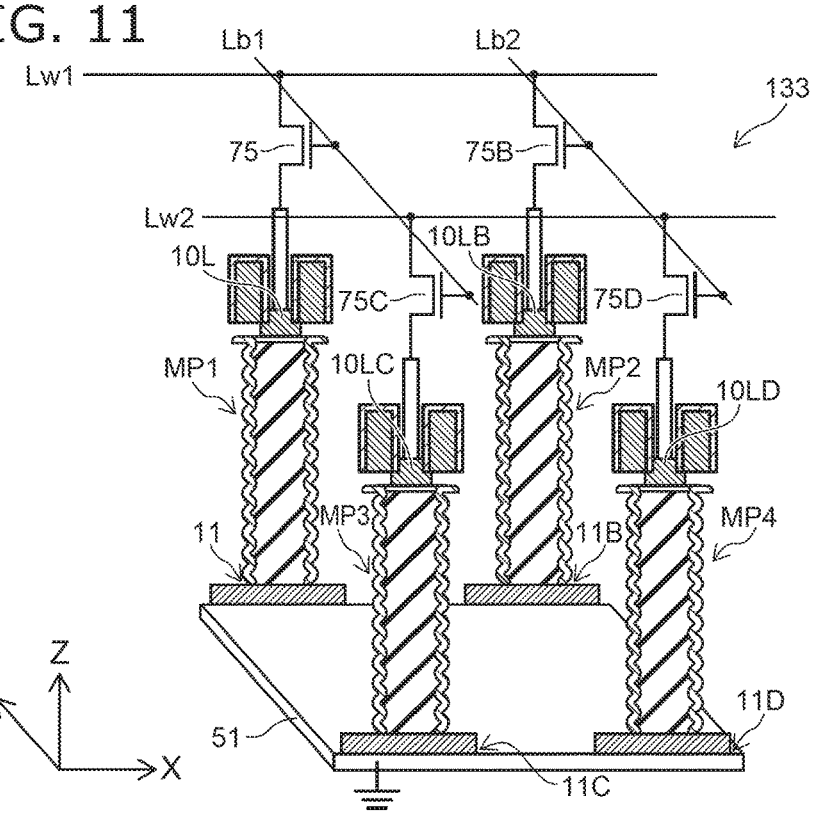
FIG. 11 is a schematic perspective view illustrating another magnetic memory device according to the first embodiment.

FIG. 11 is a schematic perspective view illustrating another magnetic memory device according to the first embodiment.

As shown in FIG. 11, in the magnetic memory device 133, a plurality of memory portions (the first memory portion MP1, the second memory portion MP2, eth third memory portion MP3, and the fourth memory portion MP4) are provided. In this example, one electrode (the first electrode 51) is provided with respect to these memory portions. The first electrode 51 is electrically connected with the first magnetic portion 11, the fourth magnetic portion 11B, the magnetic portion 11C, and the magnetic portion 11D.

A first interconnect Lw1, a second interconnect Lb1, a third interconnect Lw2, and a fourth interconnect Lb2 are provided. The first interconnect Lw1 and the third interconnect Lw2 extend along the X-axis direction, for example. The second interconnect Lb1 and fourth interconnect Lb2 extend along the Y-axis direction, for example.

The first functional element 75, the second functional element 75B, the third functional element 75C, and the fourth functional element 75D are provided. In this example, these functional elements are transistors.

An end of the first functional element 75 is electrically connected with the first magnetic layer 10L. Another end of the first functional element 75 is electrically connected with first interconnect Lw1. A gate of the first functional element 75 is electrically connected with second interconnect Lb1.

An end of the second functional element 75B is electrically connected with second magnetic layer 10LB. Another end of the second functional element 75B is electrically connected with first interconnect Lw1. A gate of the second functional element 75B is electrically connected with fourth interconnect Lb2.

An end of the third functional element 75C is electrically connected with third magnetic layer 10LC. Another end of the third functional element 75C is electrically connected with third interconnect Lw2. A gate of the third functional element 75C is electrically connected with second interconnect Lb1.

An end of the fourth functional element 75D is electrically connected with fourth magnetic layer 10LD. Another end of the fourth functional element 75D is electrically connected with third interconnect Lw2. A gate of the fourth functional element 75D is electrically connected with fourth interconnect Lb2.

One of the plurality of the memory portions is selected by potentials of the plurality of the interconnects. In the selected memory portion, the writing operation, the shift operation, or the reading operation is performed.

For example, the first interconnect Lw1 and the third interconnect Lw2 function as a word line. The second interconnect Lb1 and the fourth interconnect Lb2 function as a bit line, for example.

Figure 12A:
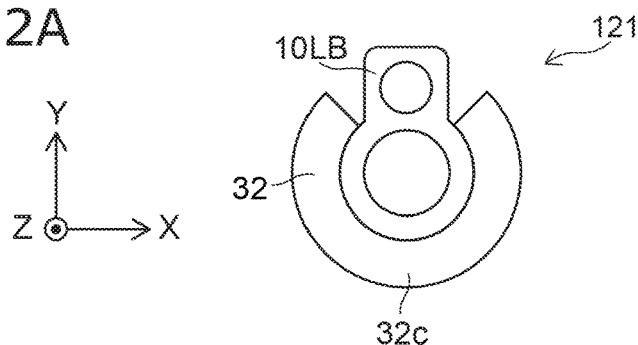
FIG. 12A and FIG. 12B are a schematic view illustrating the magnetic memory device according to the first embodiment.
Figure 12B:
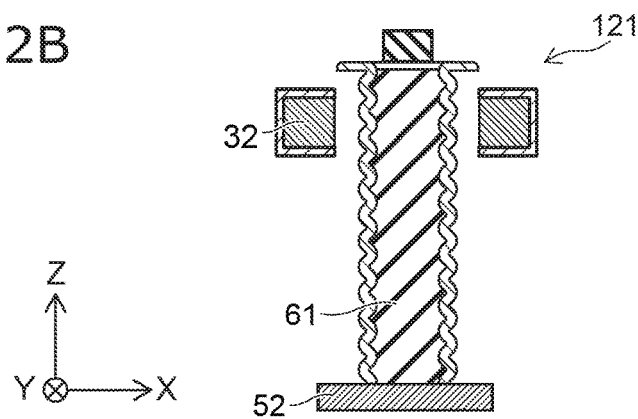

FIG. 12A and FIG. 12B are a schematic view illustrating the magnetic memory device according to the first embodiment.

In FIG. 12A and FIG. 12B, the second memory portion MP2 is provided in a magnetic memory device 121. In the second memory portion MP2, the second magnetic member 10B, the second electrode 52 and second magnetic layer 10LB, and the second non-magnetic layer 10nB are provided. In FIG. 12A and FIG. 12B, the second magnetic layer 10LB and the second non-magnetic layer 10nB are not shown.

The second magnetic member 10B includes the second extending portion 10eB being tubular. The second extending portion 10eB extends along the first direction (Z-axis direction). The second extending portion 10eB includes the fourth magnetic portion 11B and the fifth magnetic portion 12B. A direction from the fourth magnetic portion 11B toward the fifth magnetic portion 12B is along the first direction. The second magnetic member 10B further includes the sixth magnetic portion 13B. The sixth magnetic portion 13B is connected with the fifth magnetic portion 12B.

The second conductive layer 32 is provided. At least a part of the second conductive layer 32 is curved along the second extending portion 10eB.

The second conductive layer 32 may be continuous with the first conductive layer 31. In such a case, the first conductive layer 31 may also include the fourth conductive portion 31d (refer to FIG. 6). The fourth conductive portion 31d may function as the second conductive layer 32. In such a case, at least a part of the fourth conductive portion 31d is curved along the second extending portion 10eB.

Second Embodiment

Figure 13:
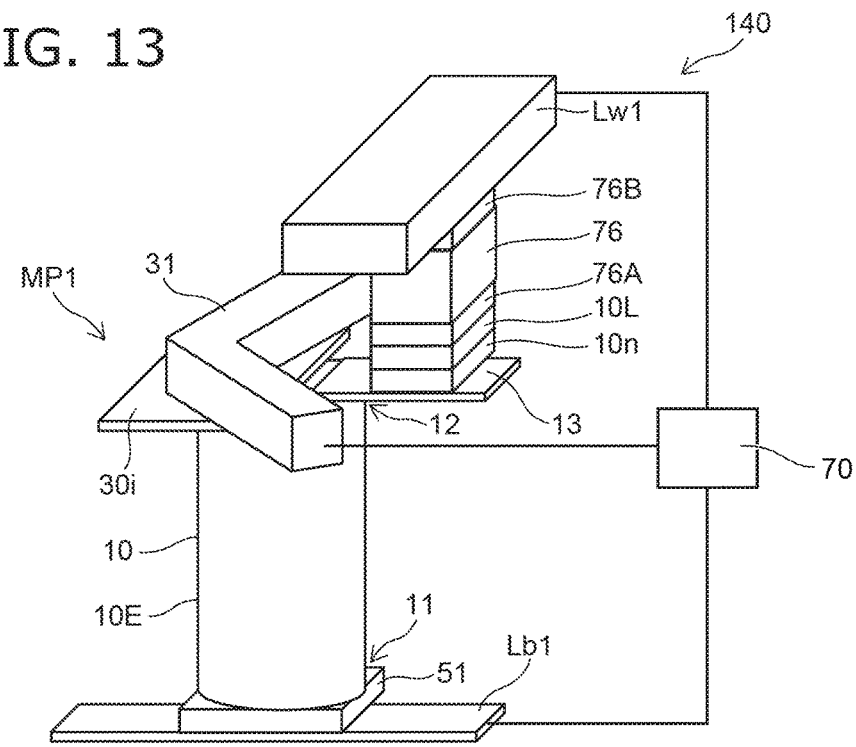
FIG. 13 is a schematic perspective view illustrating a magnetic memory device according to a second embodiment.

FIG. 13 is a schematic perspective view illustrating a magnetic memory device according to a second embodiment.

As shown in FIG. 13, a magnetic memory device 140 includes the first magnetic member 10, the first electrode 51, the first magnetic layer 10L, the first non-magnetic layer 10n, and the controller 70. In the magnetic memory device 140, an element layer 76 is further provided. The element layer 76 is one example of the first functional element 75, for example. In the magnetic memory device 140, the configuration other than the element layer 76 is the same as the magnetic memory devices (for example, magnetic memory device 110 or 120 etc.) described about the first embodiment. Hereinafter, the element layer 76 is described.

The element layer 76 is provided on a current path between the first magnetic layer 10L and the controller 70. In this example, the element layer 76 is provided between the first magnetic layer 10L and the first interconnect Lw1. A conductive film 76A is provided between the element layer 76 and the first magnetic layer 10L. A conductive film 76B is provided between the first interconnect Lw1 and the element layer 76. The first magnetic layer 10L is located between the element layer 76 and the first non-magnetic layer 10n.

The first electrode 51 is electrically connected with the second interconnect Lb1, for example.

The element layer 76 includes at least one selected from the group consisting of Ge and Te, for example. The element layer 76 functions, for example as a nonlinear element. In the element layer 76, for example the slope of the I-V characteristic in a first voltage range is different from the slope of the I-V curve in a second voltage range. The element layer 76 has diode characteristic for example. In the element layer 76, the slope of the I-V characteristic in a third voltage range is different from the slope of the I-V curve in first and second voltage ranges. These voltage ranges are different from each other. The element layer 76 has an ovonic threshold switch characteristic, for example.

By providing the element layer 76, one of the memory portions can be selected. In a magnetic memory device 140, few interconnects are provided in one memory portion. A high-density magnetic memory device can be provided.

Figure 14:
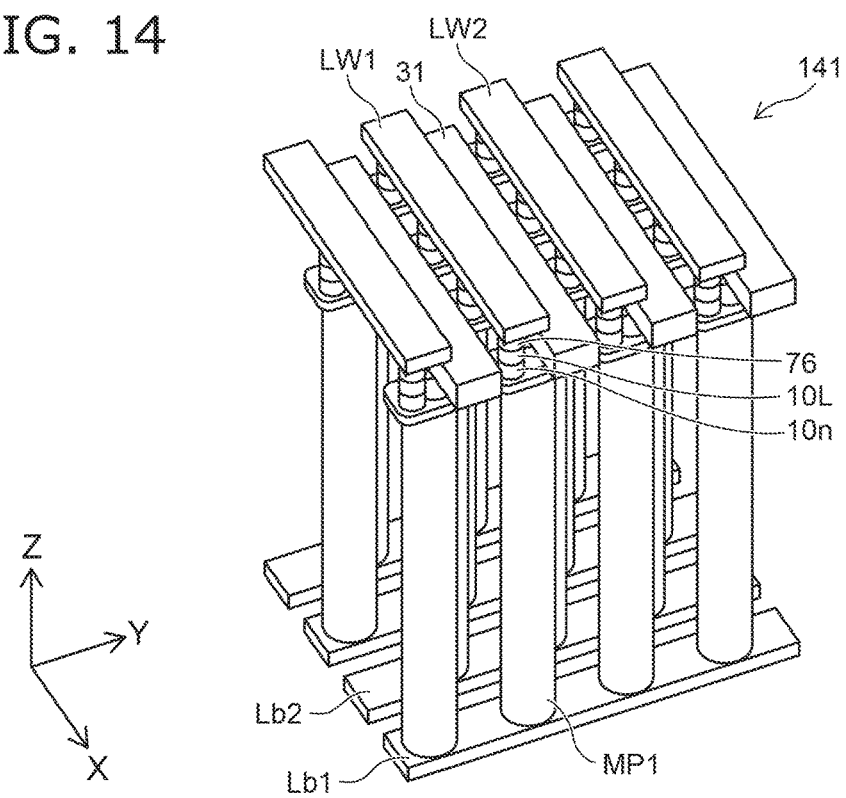
FIG. 14 is a schematic perspective view illustrating another magnetic memory device according to the second embodiment.

FIG. 14 is a schematic perspective view illustrating another magnetic memory device according to the second embodiment.

As shown in FIG. 14, a magnetic memory device 141 includes a plurality of memory portions (for example, first memory portion MP1 etc.). Conductive layers (for example, first conductive layer 31 etc.) are straight lines-like.

Figure 15:
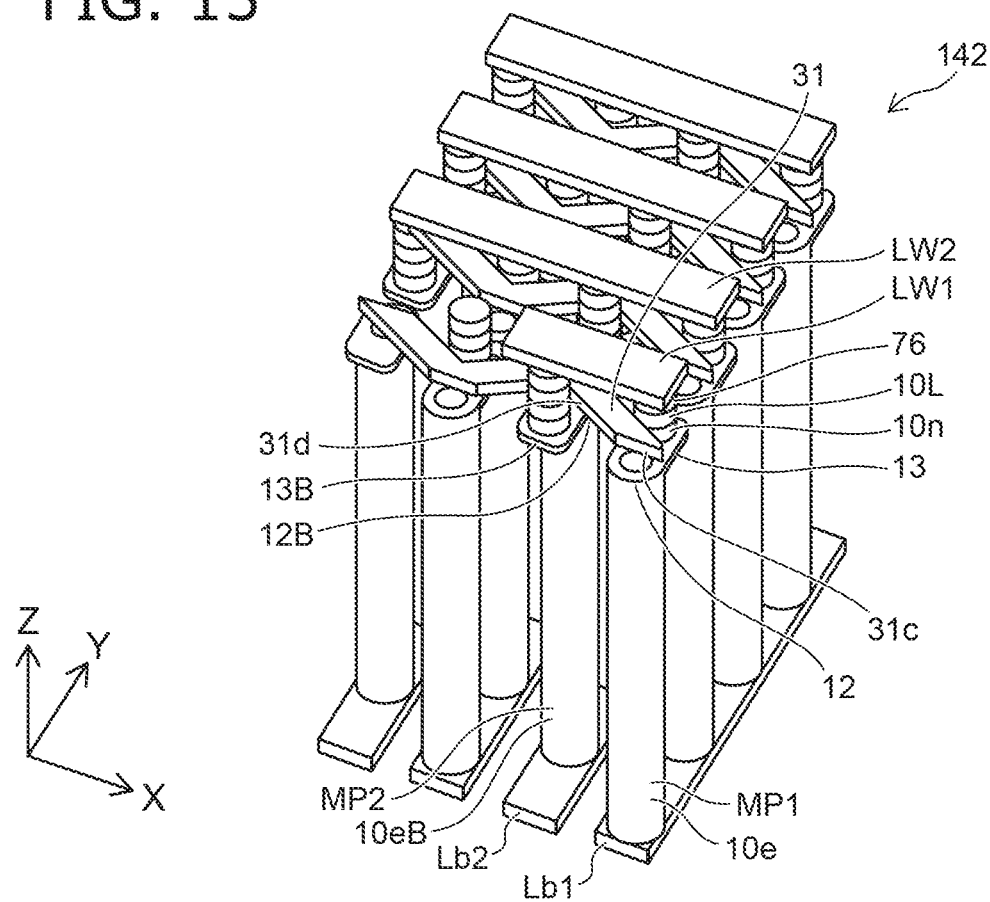
FIG. 15 is a schematic perspective view illustrating another magnetic memory device according to the second embodiment.

FIG. 15 is a schematic perspective view illustrating another magnetic memory device according to the second embodiment.

As shown in FIG. 15, a magnetic memory device 142 includes a plurality of memory portions (for example, first memory portion MP1 etc.). Conductive layers (for example, first conductive layer 31 etc.) bend in the shape of ZIG ZAG.

A second direction from the second magnetic portion 12 toward the third magnetic portion 13 is taken as the Y-axis direction. A direction crossing a plane (Z-Y plane) including the first direction (Z-axis direction) and the second direction (Y-axis direction) is taken as a third direction. The third direction in this case is along the X-axis direction. In the third direction, at least a part of the fourth conductive portion 31s overlap the first conductive layer 10L.

Also in the magnetic memory devices 140-142, the stable operation is possible.

Hereinafter, the example of the material in the embodiment is described.

The first magnetic member 10 includes a perpendicular magnetization film, for example.

The first magnetic member 10 may also include a rare earth-transition metal amorphous alloy, for example. The rare earth-transition metal amorphous alloy includes an alloy including a rare earth transition metal and a 3d transition metal, for example. The rare earth-transition metal amorphous alloy is a ferrimagnetic material, for example. The rare earth-transition metal amorphous alloy includes at least one selected from the group consisting of Tb (terbium, Dy (dysprosium), and Gd (gadolinium), for example, and at least one of the transition metals. The rare earth-transition metal amorphous alloy includes at least one selected from the group consisting of TbFe, TbCo, TbFeCo, DyTbFeCo, GdTbCo, and GdFeCo, for example.

The first magnetic member 10 may also include a multilayer film, for example. The first magnetic member 10 includes at least one selected from the group consisting of the multilayer film including Co film and Ni film, the multilayer film including Co film and Pd film, and the multilayer film including Co film and Pt film, for example.

The first magnetic member 10 may also include a rule alloy, for example. The rule alloy includes at least one selected from the group consisting of Fe, Co, and Ni, for example, and at least one selected from the group consisting of Pt and Pd. The crystal structure in the rule alloy is $L_{10}$ type, for example. The rule alloy may also include at least one selected from the group consisting of $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$, for example. The composition ratio in the rule alloy is not limited above.

The first magnetic member 10 may also include the rule alloy and other elements. The other elements include at least one selected from the group consisting of V, Mn, Cu, Cr, B, and Ag, for example. An anisotropy energy or a saturation magnetization may be adjusted by addition of these elements, for example. For example, a large anisotropy energy is obtained.

The first magnetic layer 10L includes at least one selected from the group consisting of Fe, Co, and Ni, for example. The first magnetic layer 10L may also include an alloy including at least one selected from the group consisting of Fe, Co, and Ni, for example. The first magnetic layer 10L may also further include other elements (for example, half-metal), for example. Other elements include at least one selected from the group consisting of boron and silicon, for example. The first magnetic layer 10L may also include a multilayer film, for example. A multilayer film includes a first film and a second film. The first film includes at least one selected from the group consisting of Fe, Co, and Ni, for example. The second film includes platinum metals (for example, Pt, Pd, etc.). The first magnetic layer 10L includes a multilayer film (Co—Fe/Ni multilayer film) including the film and nickel film of a Co—Fe alloy, for example.

The first electrode 51 includes at least one selected from the group consisting of Cu, Ag, Au, and Al, for example. At least either of these electrodes may also include an alloy including at least one of the elements of these.

The first non-magnetic layer 10n includes at least one selected from the group consisting of aluminum oxide ($AlO_x$), aluminum nitride (AlN), magnesium oxide (MgO), magnesium nitride, silicon oxide ($SiO_2$), silicon nitride (Si—N), silicon oxynitride (Si—O—N), $TiO_2$, and $Cr_2O_3$. Such materials function as a non-magnetic tunnel barrier, for example. The first non-magnetic layer 10n may also include non-magnetic metal, for example. With a suitable material (and thickness) of the first non-magnetic layer 10n, the magnetoresistive effect is effective, for example.

The first magnetic film 41 may include at least one selected from the group consisting of FeNi, and CoZr, for example. The first magnetic film 41 may include a soft ferromagnetic materials. The first magnetic film 41 may include an alloy including at least one selected from the group consisting of Fe, Co, and Ni, for example. The first magnetic film 41 may further include other elements including at least one selected from the group consisting of boron, silicon, germanium for example. The covering thickness of the first magnetic film 41 on the conductive layer 31 is not less than 1 nm and not more than 10 nm, for example.

According to the embodiment, a magnetic memory device capable of stably operating can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic members, magnetic layers, non-magnetic layers, conductive layers, electrodes, insulating layers, magnetic films, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first magnetic member including a first extending portion being tubular and a third magnetic portion, the first extending portion including a first magnetic portion and a second magnetic portion, the first extending portion extending along a first direction, the third magnetic portion being connected with the second magnetic portion, a direction from the first magnetic portion toward the second magnetic portion being along the first direction;
a first electrode electrically connected with the first magnetic portion;
a first magnetic layer;
a first non-magnetic layer provided between the first magnetic layer and at least a part of the third magnetic portion;
a first conductive layer including a first conductive portion, a second conductive portion, and a third conductive portion being between the first conductive portion and the second conductive portion, a direction from at least a part of the second magnetic portion toward at least a part of the third conductive portion being along the first direction; and
a controller electrically connected with the first electrode, the first magnetic layer, the first conductive portion and the second conductive portion,
the controller being configured to supply a first current to the first conductive layer in a first operation, the first current flowing between the first conductive portion and the second conductive portion, and
the controller being configured to apply a voltage between the first electrode and the first magnetic layer in a second operation.

2. The device according to claim 1, wherein
the at least the part of the third conductive portion curves along the second magnetic portion.

3. The device according to claim 1, wherein
a direction from another portion of the third conductive portion toward the second magnetic portion crosses the first direction.

4. The device according to claim 3, wherein
the second magnetic portion is located around the other portion of the third conductive portion.

5. The device according to claim 3, wherein
the other portion of the third conductive portion is located around the first extending portion.

6. The device according to claim 1, further comprising a first insulating layer provided between the at least the part of the second magnetic portion and the at least the part of the third conductive portion.

7. The device according to claim 6, wherein a thickness of the first insulating layer along the first direction is not less than 2.5 nm and not more than 20 nm.

8. The device according to claim 1, further comprising:
a second magnetic member including a second extending portion being tubular and a sixth magnetic portion, the second extending portion including a fourth magnetic portion and a fifth magnetic portion, the second extending portion extending along the first direction, the sixth magnetic portion being connected with the fifth magnetic portion, a direction from the fourth magnetic portion toward the fifth magnetic portion being along the first direction;
a second electrode electrically connected with the fourth magnetic portion;
a second magnetic layer; and
a second non-magnetic layer provided between the second magnetic layer and at least a part of the sixth magnetic portion,
the first conductive layer further including a fourth conductive portion being between the third conductive portion and the second conductive portion, a direction from at least a part of the fifth magnetic portion toward at least a part of the fourth conductive portion being along the first direction,
the controller being further electrically connected with the second electrode and the second magnetic layer.

9. The device according to claim 8, wherein
a direction from the first extending portion toward the second extending portion is along a second direction crossing the first direction, and
a direction from the first magnetic layer toward the second magnetic layer is along the second direction.

10. The device according to claim 8, wherein
a direction from the first extending portion toward the second extending portion crosses a direction from the first magnetic layer toward the second magnetic layer.

11. The device according to claim 8, wherein
a second direction from the second magnetic portion toward the third magnetic portion crosses the first direction, and
a direction from the at least the part of the third conductive portion toward the at least the part of the fourth conductive portion crosses the second direction.

12. The device according to claim 8, wherein
a second direction from the second magnetic portion toward the third magnetic portion crosses the first direction, and
the at least the part of the fourth conductive portion overlaps the first magnetic layer in a third direction, the third direction crosses a plane including the first direction and the second direction.

13. A magnetic memory device, comprising:
a first magnetic member including a first extending portion being tubular and a third magnetic portion, the first extending portion including a first magnetic portion and a second magnetic portion, the first extending portion extending along a first direction, the third magnetic portion being connected with the second magnetic portion, a direction from the first magnetic portion toward the second magnetic portion being along the first direction;
a first electrode electrically connected with the first magnetic portion;
a first magnetic layer;
a first non-magnetic layer provided between the first magnetic layer and at least a part of the third magnetic portion;
a first conductive layer including a first conductive portion, a second conductive portion, and a third conductive portion being between the first conductive portion and the second conductive portion, at least a part of the third conductive portion curving along the first extending portion; and
a controller electrically connected with the first electrode, the first magnetic layer, the first conductive portion and the second conductive portion,
the controller being configured to supply a first current to the first conductive layer in a first operation, the first current flowing between the first conductive portion and the second conductive portion, and
the controller being configured to apply a voltage between the first electrode and the first magnetic layer in a second operation.

14. The device according to claim 13, wherein a distance between the first extending portion and the third conductive portion is not less than 2.5 nm and not more than 20 nm.

15. The device according to claim 13, further comprising:
a second magnetic member including a second extending portion being tubular and a sixth magnetic portion, the second extending portion including a fourth magnetic portion and a fifth magnetic portion, the second extending portion extending along the first direction, the sixth magnetic portion being connected with the fifth magnetic portion, a direction from the fourth magnetic portion toward the fifth magnetic portion being along the first direction;
a second electrode electrically connected with the fourth magnetic portion;
a second magnetic layer; and
a second non-magnetic layer provided between the second magnetic layer and at least a part of the sixth magnetic portion,
the first conductive layer further including a fourth conductive portion being between the third conductive portion and the second conductive portion, at least a part of the fourth conductive portion curving along the second extending portion,
the controller being further electrically connected with the second electrode and the second magnetic layer.

16. The device according to claim 1, wherein the controller is configured to detect a value corresponding to an electrical resistance between the first electrode and the first magnetic layer in a third operation.

17. The device according to claim 1, wherein
the first operation includes a writing operation to write information to the first magnetic member, and
the second operation includes a shift operation to shift information written in the first magnetic member.

18. The device according to claim 1, wherein
information being written when the first current flows from the first conductive portion toward the second conductive portion is different from information being written when the first current flows from the second conductive portion toward the first conductive portion.

19. The device according to claim 1, further comprising an element layer provided on a current path between the first magnetic layer and the controller, and
the element layer includes at least one selected from the group consisting of Ge and Te.

20. The device according to claim 19, wherein the first magnetic layer is located between the element layer and the first non-magnetic layer.

* * * * *